United States Patent
Engelmann (10) Patent No.: US 10,237,972 B2
(45) Date of Patent: Mar. 19, 2019

(54) PLASTIC COMPONENT WITH AT LEAST ONE ELECTRICAL CONTACT ELEMENT AND METHOD FOR THE MANUFACTURE THEREOF

(71) Applicant: KRALLMANN KUNSTSTOFFVERARBEITUNG GMBH, Hiddenhausen (DE)

(72) Inventor: Eduard Engelmann, Bünde (DE)

(73) Assignee: KRALLMANN KUNSTSTOFFVERARBEITUNG GMBH, Hiddenhausen (DE)

( * ) Notice: Subject to any disclaimer, the term of this patent is extended or adjusted under 35 U.S.C. 154(b) by 0 days.

(21) Appl. No.: 15/327,785

(22) PCT Filed: Jul. 20, 2015

(86) PCT No.: PCT/EP2015/001491
§ 371 (c)(1),
(2) Date: Jan. 20, 2017

(87) PCT Pub. No.: WO2016/012090
PCT Pub. Date: Jan. 28, 2016

(65) Prior Publication Data
US 2017/0215276 A1    Jul. 27, 2017

(30) Foreign Application Priority Data

Jul. 21, 2014  (DE) .................. 10 2014 010 628

(51) Int. Cl.
*H05K 1/02*   (2006.01)
*H05K 1/03*   (2006.01)
(Continued)

(52) U.S. Cl.
CPC ........... *H05K 1/0284* (2013.01); *B29C 45/16* (2013.01); *H01H 1/021* (2013.01); *H05K 1/0313* (2013.01);
(Continued)

(58) Field of Classification Search
CPC .. H05K 1/0284; H05K 1/0313; H05K 3/0014; H05K 1/117
See application file for complete search history.

(56) References Cited

U.S. PATENT DOCUMENTS 5,081,520 A * 1/1992 Yoshii ................... H01L 21/563
257/702
6,700,074 B2 * 3/2004 Michel ................... H05K 1/189
174/254
(Continued)

FOREIGN PATENT DOCUMENTS

DE     12 99 801 B    7/1969
DE     44 32 966 A1   3/1996
(Continued)

*Primary Examiner* — Ishwarbhai B Patel
(74) *Attorney, Agent, or Firm* — McGlew and Tuttle, P.C.

(57) ABSTRACT

A plastic component with at least one electrical contact element has a plastic body and at least one electrical strip conductor, by which the electrical contact element can be electrically connected. Provisions are made for the plastic component to be manufactured by a combined injection molding and metal casting method, in which the plastic body is manufactured by an injection molding method and the at least one electrical strip conductor is manufactured by a metal casting or metal injection molding method one after another. The component formed last is molded onto the component formed first. Further, a method for manufacturing a corresponding plastic component is described.

16 Claims, 6 Drawing Sheets

(51) Int. Cl.
*H05K 1/11* (2006.01)
*H01H 1/021* (2006.01)
*B29C 45/16* (2006.01)
*H05K 3/00* (2006.01)
*H05K 3/10* (2006.01)
*H01H 11/06* (2006.01)
*H05K 3/40* (2006.01)

(52) U.S. Cl.
CPC ........... *H05K 1/117* (2013.01); *H05K 3/0014* (2013.01); *H05K 3/101* (2013.01); *B29C 2045/169* (2013.01); *B29C 2045/1696* (2013.01); *H01H 2011/065* (2013.01); *H05K 1/0278* (2013.01); *H05K 1/0296* (2013.01); *H05K 1/11* (2013.01); *H05K 1/119* (2013.01); *H05K 3/107* (2013.01); *H05K 3/4092* (2013.01); *H05K 2201/09081* (2013.01); *H05K 2201/09118* (2013.01); *H05K 2201/09754* (2013.01); *H05K 2201/2072* (2013.01)

(56) References Cited

U.S. PATENT DOCUMENTS

| | | | | |
|---|---|---|---|---|
| 6,790,059 | B2* | 9/2004 | Poehlau | H01R 13/035 |
| | | | | 439/110 |
| 9,560,772 | B2* | 1/2017 | Kopf | H05K 1/119 |
| 2007/0001664 | A1* | 1/2007 | Steinbrink | G01D 11/245 |
| | | | | 324/174 |
| 2007/0207644 | A1* | 9/2007 | Pollmann | B29C 45/14639 |
| | | | | 439/131 |

FOREIGN PATENT DOCUMENTS

| | | |
|---|---|---|
| DE | 10 2009 022 238 A1 | 11/2010 |
| DE | 10 2010 064 351 A1 | 3/2012 |
| DE | 10 2011 101 956 A1 | 11/2012 |
| DE | 10 2012 212 798 A1 | 6/2013 |
| EP | 1 780 541 A1 | 5/2007 |

\* cited by examiner

FIG. 9 ions are
PLASTIC COMPONENT WITH AT LEAST ONE ELECTRICAL CONTACT ELEMENT AND METHOD FOR THE MANUFACTURE THEREOF

CROSS REFERENCE TO RELATED APPLICATIONS

This application is a United States National Phase Application of International Application PCT/EP2015/001491 filed Jul. 20, 2015 and claims the benefit of priority under 35 U.S.C. § 119 of German Application 10 2014 010 628.4 filed Jul. 21, 2014 the entire contents of which are incorporated herein by reference.

FIELD OF THE INVENTION

The present invention pertains to a plastic component with at least one electrical contact element, wherein the plastic component has a plastic body and at least one electrical strip conductor, by means of which the electrical contact element can be electrically connected. The present invention further pertains to a method for manufacturing a corresponding plastic component.

BACKGROUND OF THE INVENTION

It is necessary in many areas of technology to elicit a switching operation by two electrical contact elements located at spaced locations from one another being adjusted relative to one another and brought into contact with one another, as a result of which a flow of electrical current is brought about, which elicits the switching operation. The electrical contact elements are usually arranged on a plastic body acting as a carrier and are electrically connected via a strip conductor configured as a plastic body. To form an electrical strip conductor on a plastic component, it is known that the plastic body is prepared in a first step by injection molding and the strip conductor is formed on the plastic body in a subsequent method step. This can be achieved, for example, by the strip conductor being punched out of a metal sheet and later placed on the prefabricated plastic body. It is, however, also possible to later extrusion coat the strip conductor punched out of metal sheet with the plastic material forming the plastic body.

Moreover, it is known that the plastic body and a metallizable body can first be prepared and the metallizable body is later metallized by, for example, an electroplating operation.

These methods are associated with the drawback of being very complicated and hence costly.

A method for two-component injection molding, in which a plastic component is prepared by means of an injection molding and a metal component is injected on the plastic component, is generally known from DE 10 2011 101 956 A1. A special nozzle is used for this for injecting metal, which has, among other things, a heated nozzle tube.

SUMMARY OF THE INVENTION

A basic object of the present invention is to provide a plastic component with at least one electrical contact element and with a strip conductor, which component can be manufactured in a simple manner. Further, a method for manufacturing a corresponding plastic component shall be provided.

With respect to the plastic component, provisions are made for the plastic component to be manufactured by means of a combined injection molding and metal casting method, in which the plastic component is manufactured by means of an injection molding method and in which at least one electrical strip conductor is manufactured by means of a metal casting or metal injection molding method one after another, wherein the component formed last is molded onto the component formed first. The manufacture of the plastic component and of the two components preferably takes place one after another in a combined injection mold, with which the plastic material and, independently therefrom, also a liquid metal or a metal alloy can be processed. The metallic material is introduced especially by means of a metal injection molding method. It is possible in this manner to manufacture the plastic component together with the electrical strip conductor and with the contact element in a uniform method very rapidly and cost-effectively. The plastic body is preferably manufactured in a first step, and the electrical strip conductor is then molded onto it. However, this sequence may also be reversed if this is permitted by the geometry of the component.

Provisions are made in a preferred embodiment of the present invention for the plastic body to have a channel-like (channel shaped, channel) groove, in which the strip conductor is arranged. After the plastic body with the channel-like groove has been manufactured, the liquid metal can be introduced directly into the channel-like groove and it is guided by the walls of the groove. The liquid metal flows along the channel-like groove and fills same completely, as a result of which the electrical strip conductor is formed. The liquid metal can be introduced into the channel-like groove by pouring in directly or preferably by injecting the metal melt into the groove.

To hold the strip conductor reliably in the groove, the latter may be held, at least in some areas, in a positive-locking manner in the groove or on the plastic body. Provisions may be made for this purpose for forming undercuts in or on the groove, with which undercuts the strip conductor meshes at least partially. When the liquid metal is introduced into the groove, it flows behind the undercuts, so that it is held securely and nondetachably in the groove in the solidified state. A corresponding positive-locking arrangement of the strip conductor on the plastic body may also be provided if no groove is formed.

The groove may be formed by a depression formed in the plastic body, but it is also possible to provide on the plastic body ribs, which preferably extend essentially parallel and between which the channel-like groove is formed. The ribs offer the additional advantage that they increase the flexural rigidity of the plastic body and hence the stability thereof.

The plastic component has at least one electrical contact element, which can come into contact with an additional electrical contact, which is formed on another component, to achieve a switching operation. Provisions may be made in the simplest embodiment for the electrical contact element to be formed by a projecting tip-like contact point formed at or on the strip conductor.

Provisions are made in a preferred embodiment of the present invention for the electrical contact element to be a spring bracket contact, which encloses a spring bracket of the plastic body, on which spring bracket a section of the strip conductor is arranged. The spring bracket is preferably configured as a freely projecting spring bracket, i.e., it is connected to the plastic body on one side only and is freely surrounded by the plastic body or by recesses in the plastic body on all other sides. This is associated with the advantage that the bracket can be adjusted relative to the plastic body by being deflected from its starting position by means of a suitable actuating element while undergoing elastic deformation. As soon as the corresponding adjusting force acts on the spring bracket, the latter returns into the starting position based on its internal stresses.

The strip conductor extends on the spring bracket and extends over the connection area of the spring bracket to the plastic body up to the surface thereof. It is achieved in this way that the stability and the elasticity of the electrical contact element are formed nearly exclusively by the plastic material of the plastic body and of the spring bracket, so that the material forming the strip conductor is only subject to low stresses, as a result of which useful life is prolonged.

To have a defined contact point, provisions may be made in a variant of the present invention for the spring bracket to have, in the area of its free end, a projection, which is covered by the strip conductor. The projection may have, for example, a tip-like or pin-like configuration. The projection covered by the strip conductor projects over the strip conductor in the motion direction of the spring bracket, so that it is achieved in a reliable manner that the spring bracket comes into contact with the opposite contact at this contact point during its actuation, so that exact switching operations are achieved.

In another embodiment of the present invention, the electrical contact element may be a plug, which encloses a tongue, which projects from the plastic body and at which a section of the strip conductor is arranged. The tongue is dimensioned such that it maintains its position at the plastic body relative to the plastic body, i.e., it does not yield elastically. The strip conductor extends from the plastic body to the surface of the tongue, so that the latter can act as a plug, on which an opposite plug of, for example, a cable harness can be placed.

Provisions may be made in another embodiment of the present invention for the electrical contact element to be a contact bush, which encloses a sleeve-like (sleeve shaped, sleeve) carrying part, wherein a section of the strip conductor is arranged on the inner wall of the sleeve-like carrying part. The sleeve-like carrying part is preferably an integral part of the plastic body and is thus connected to same in one piece and it freely projects from the plastic body. The inner wall of the interior space of the sleeve-like carrying part is at least partially and preferably completely covered with the electrically conductive material, and a plug, for example, a jack plug, can be inserted into the interior space of the carrying part.

The sleeve-like carrying part is seated with one end on the body and projects from same. Provisions may now be made for a perforation, which connects the interior space of the sleeve-like carrying part to the side of the plastic body facing away from the carrying part, to be formed in the plastic body in the connection area of the carrying part, wherein the strip conductor passes through the perforation. The strip conductor can be led in this manner on the plastic body up to the carrying part on the side of the plastic body facing away from the carrying part, after which it passes through the plastic body at the perforation and passes over into the section of the strip conductor arranged on the inner wall of the carrying part. A simple and good contacting is possible in this way.

Provisions may be made in another embodiment of the present invention for at least one prefabricated contact rivet, which may be embedded by injection molding or extrusion-coated during the manufacture of the plastic body, to be integrated in the plastic body. The contact rivet is electrically connected to the strip conductor. It is possible in this way to form a contact element, whose material does not necessarily correspond to the material of the strip conductor, but it is possible to adapt the material of the contact rivet to the desired parameters and especially to manufacture the contact rivet from a material that is harder than that of the strip conductor.

Provisions may be made in a possible embodiment of the present invention for the plastic body to be essentially plate-shaped. It is, however, also possible to configure the plastic body in another configuration, for example, as a housing.

With respect to the method, the above object is accomplished by the plastic component being manufactured means of a combined injection molding and metal casting method, in which a plastic body is manufactured by means of an injection molding method and at least one strip conductor is manufactured by means of a metal casting or metal injection molding method one after another, the component formed last being molded onto the component formed first.

Provisions are preferably made for manufacturing first the body and then molding the strip conductor onto this. It is, however, also possible as an alternative to prepare the electrical strip conductor first and to later mold the plastic body onto this.

Provisions are made in a preferred embodiment of the present invention for the component formed later to be fastened to the component formed first in a positive-locking manner. This can be achieved, for example, by undercuts being formed in the component formed first, for example, in the plastic body.

As an alternative or in addition hereto, provisions may be made for the component formed later to be fastened to the component formed first by connection in substance. The material properties and the method parameters can be coordinated with one another for this purpose such that the two components will weld to one another, i.e., will form a molecular bond. As an alternative or in addition hereto, at least a surface adhesion may be provided between the two components, which can be achieved, for example, by a partial superficial melting of the material of the component formed first taking place during the molding on of the component formed later.

Any injection moldable plastic, for example, polypropylene or polyamide, may be used as the material for the plastic body. A metal alloy, which is flowable up to a temperature of 500° and may be represented, for example, by Sn alloys, may be used as a metal component.

Further details and features of the present invention will appear from the following description of exemplary embodiments with reference to the drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
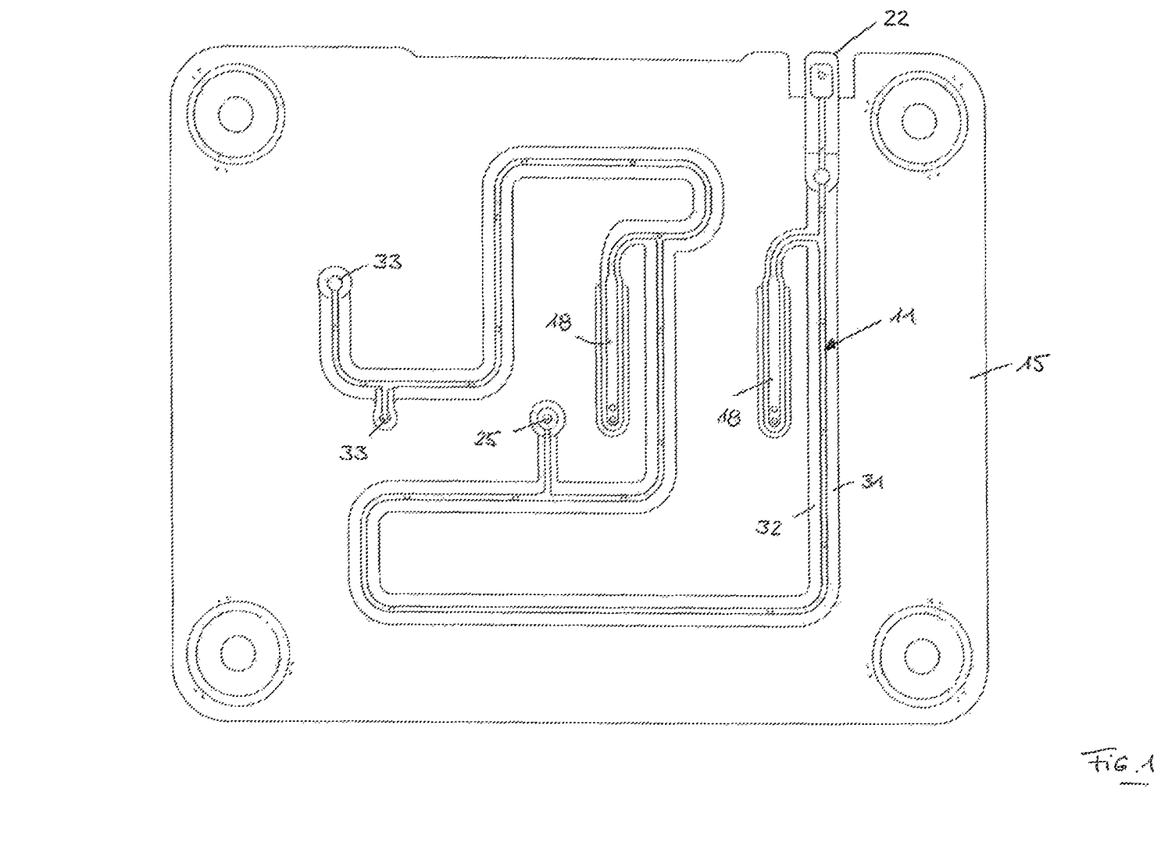
FIG. 1 is a top view of a plastic body prior to the application of the strip conductor.

Referring to the drawings, FIG. 1 shows a top view of a plate-shaped plastic body 15, which is injection molded from a plastic material in a first method step and is provided in a subsequent step with a strip conductor 17 (see FIG. 2), which is formed by molding on an electrically conductive material, especially a metal alloy, so that a plastic component 10 is formed.

A continuous, channel-like (channel shaped, channel) groove 11, which is defined by ribs 31 and 32 extending parallel, is formed in the plastic body 15. For preparation for forming electrical contact elements, a laterally projecting tongue 22, a plurality of spring brackets 18 having a freely projecting configuration, a sleeve-like carrying part 25 and a plurality of contact bodies 33 are formed on the plastic body. All the elements mentioned are connected to one another by means of the channel-like groove 11.

Figure 2:
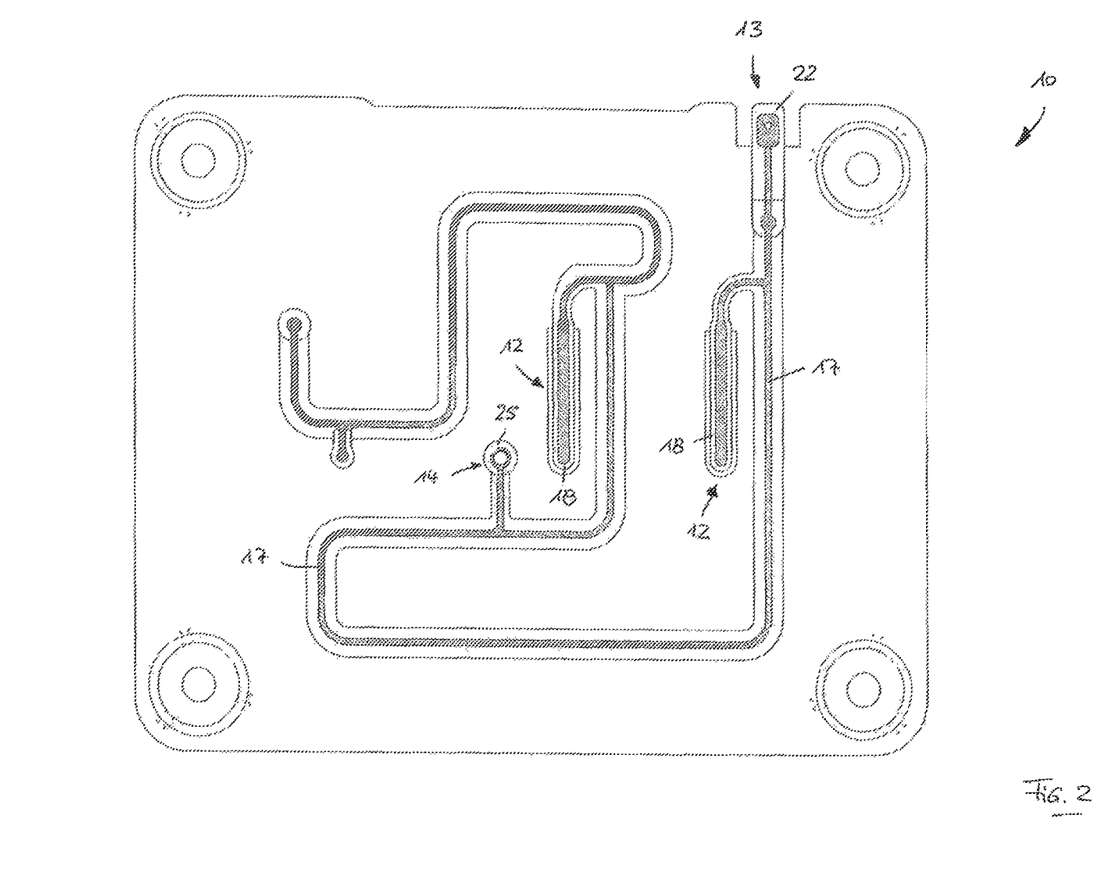
FIG. 2 is the plastic body according to FIG. 1 after application of the strip conductor.

An electrically conductive material, especially a metal alloy, is cast or injected into the groove in a second method step, so that the groove 11 is filled completely and all the components mentioned are connected to one another, forming the continuous strip conductor 17.

The structural configuration of the individual electrical contact elements will be explained in more detail below.

Figure 3:
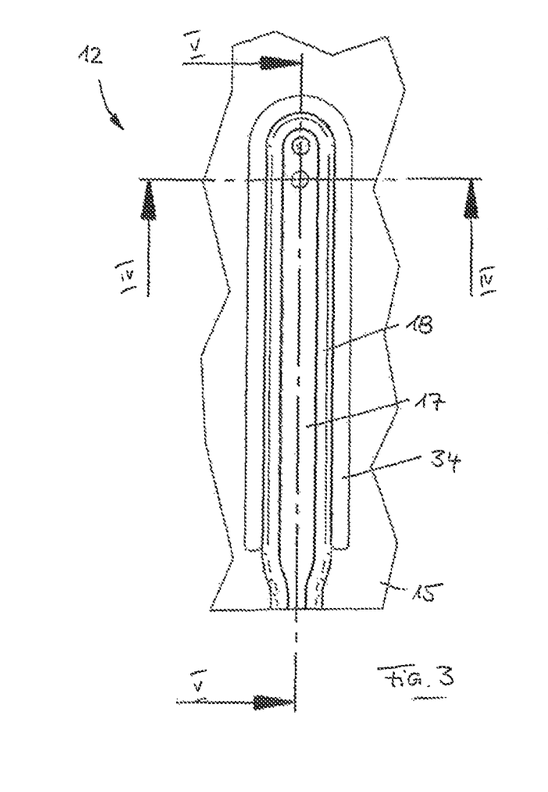
FIG. 3 is an enlarged top view of an electrical contact element in the form of a spring bracket.
Figure 4:
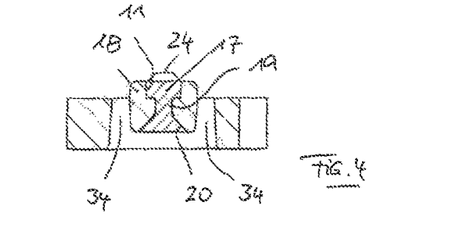
FIG. 4 is section IV-IV in FIG. 3.
Figure 5:
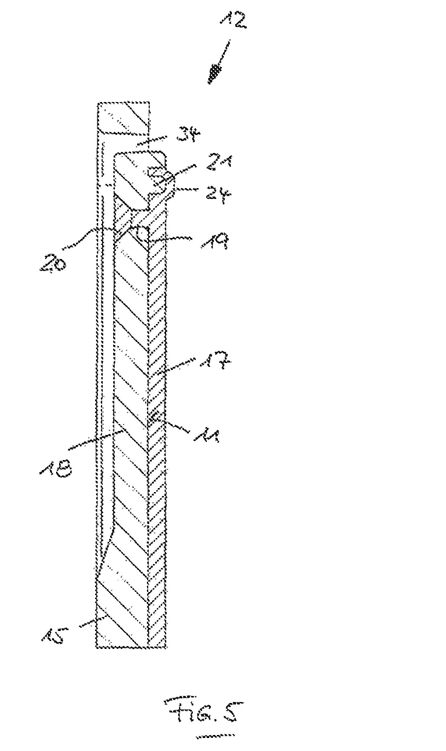
FIG. 5 is section V-V in FIG. 3.

FIGS. 3 through 5 show an electrical contact element in the form of a spring bracket contact 12. The spring bracket contact 12 has a spring bracket 18, which is formed freely projecting on the plastic body 15 and in one piece with this. The spring bracket 18 has an elongated shape and is connected at its end to the plastic body freely projecting from this connection area, i.e., the spring bracket 18 is surrounded by a recess 34 passing through the plastic body 15 on all other sides.

A section of the channel-like groove 11, which section extends over the connection area of the spring bracket 18, is formed on the top side of the spring bracket 18. The groove 11 is filled with an electrically conductive material, so that the strip conductor 17 is formed. A perforation 19, which expands in its cross section on the side facing away from the strip conductor 17, is formed in the area of the front end of the spring bracket 18 facing away from the connection area, so that the strip conductor 17 is held in a positive-locking manner.

A tip- or pin-like projection, which is covered by the strip conductor 17, is formed at the front free end of the spring bracket 18 facing away from the area, so that a contact point 24 projecting from the surface of the strip conductor 17 is formed.

Based on its geometry, the spring bracket 18 is elastically deformable at right angles to the plane of the plate of the plastic body 15, so that an adjustable switching element is formed, the deformation and resetting properties being determined by the geometry of the spring bracket 18 and the material thereof, while the strip conductor 17 is only used for the electrical connection and is thus only subject to low mechanical stresses.

Figure 6:
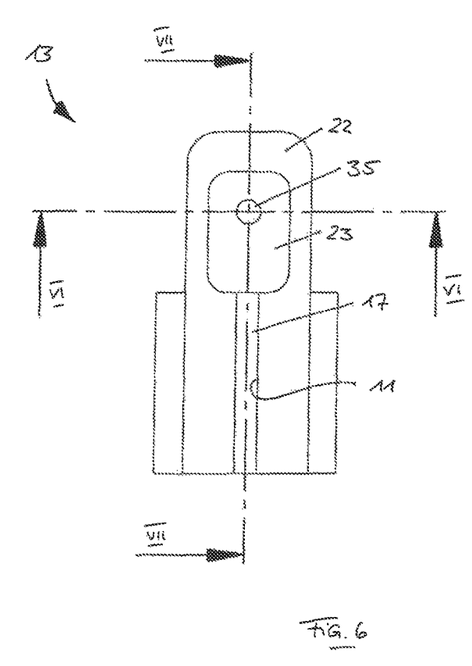
FIG. 6 is an enlarged top view of an electrical contact element in the form of a plug.
Figure 7:
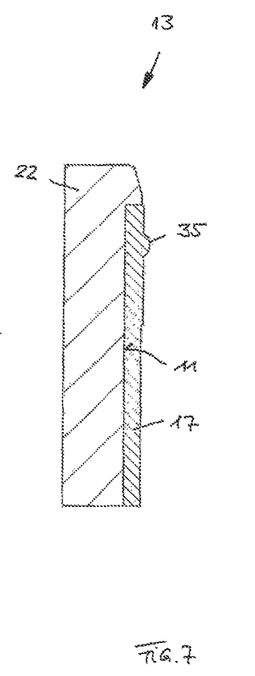
FIG. 7 is section VII-VII in FIG. 6.
Figure 8:
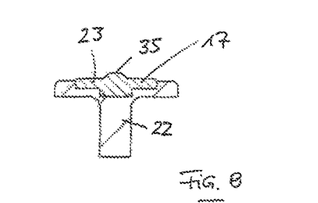
FIG. 8 is section VIII-VIII in FIG. 6.

FIGS. 6 through 8 show an embodiment of an electrical contact element in the form of a plug 13. The plug 13 has an inherently stable tongue 22, which projects from the body 15 and has a section of the channel-like groove 11 on its top side. The groove 11 has a broadened cross section in the area projecting from the plastic body 15, so that the electrically conductive material introduced into the groove 11 forms a contact plate 23 with enlarged dimensions in this area, as a result of which the reliability of the electrical contact is increased. Further, a tip-like projection 35, which forms a defined contact point, is formed on the surface of the strip conductor 17 in the area of the contact plate 23.

For example, a counterplug of a cable harness can be inserted onto the plug shown in FIGS. 6 through 8 in order to establish an electrical contact. The tip-like projection 35 may also be used as a locking element to secure the plug-type connection.

Figure 9:
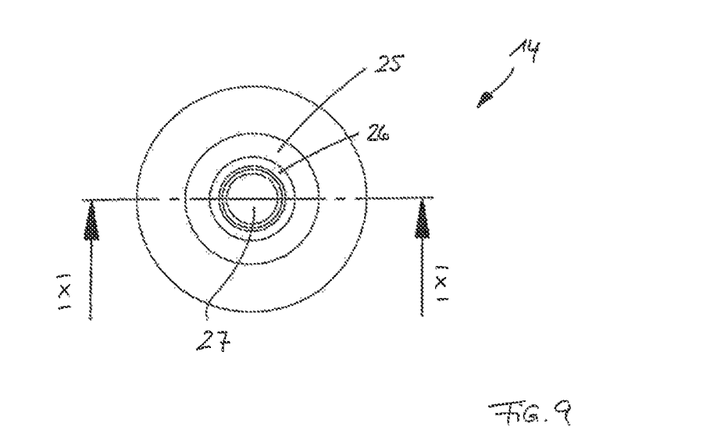
FIG. 9 is an enlarged top view of an electrical contact element in the form of a contact bush.
Figure 10:
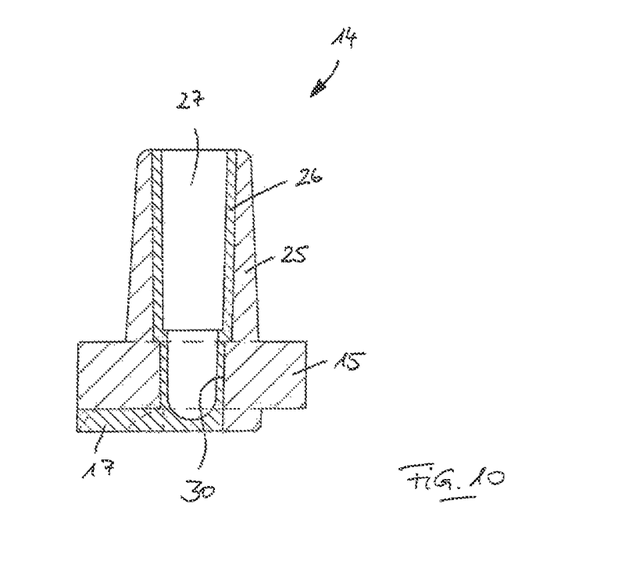
FIG. 10 is section X-X in FIG. 9.

FIGS. 9 and 10 show an electrical contact element in the form of a contact bush 14, into which a plug, for example, a jack plug, can be inserted. The contact bush 14 has a sleeve-like carrying part 25, which is made integrally with the plastic body and is made in one piece with this and projects upward, freely projecting from the plastic body 15. The groove 11, which is connected to the interior space 27 of the sleeve-like carrying part 25 via a perforation 30 provided in the plastic body 15, is formed on the side of the plastic body facing away from the sleeve-like carrying part 25. The strip conductor 17 extends in the groove 11 of the plastic body 15, passes through same at the perforation 30 and is provided as a coating 26 on the inner wall of the sleeve-like carrying part 25. A plug, which is inserted into the interior space 27 of the carrying part 25, is in connection in this manner with the strip conductor 17 located in the groove 11 through the perforation 30.

To guarantee secure holding of the strip conductor 17 in the groove, these two elements should mesh in a positive-locking manner. Possible embodiments of the cross-sectional geometries for achieving a corresponding positive-locking connection are shown in the following figures.

Figure 11:
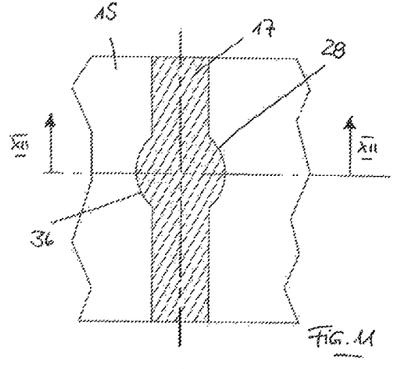
FIG. 11 is a first variant of an undercut.
Figure 12:
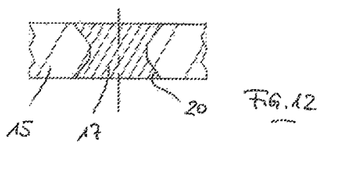
FIG. 12 is section XII-XII in FIG. 11.

According to FIG. 11, the channel-like groove 11 has a local cross-sectional expansion 36, so that an undercut 28 is formed, which brings about securing in the longitudinal direction of the groove 11. In addition to this, provisions may be made according to FIG. 12 for the groove 11 to have a cross section changing in its width over the height at least in the area of the cross-sectional expansion 36, a hyperboloid-like cross section, which forms an undercut 20 on both the top side and the underside, being provided in the exemplary embodiment being shown.

Figure 13:
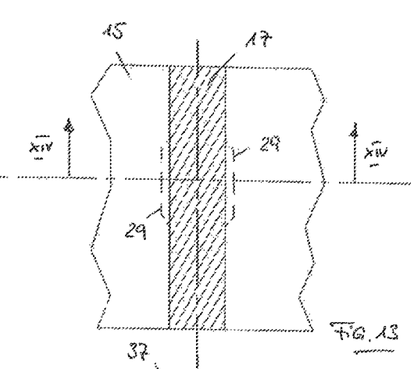
FIG. 13 is a second variant of an undercut.
Figure 14:
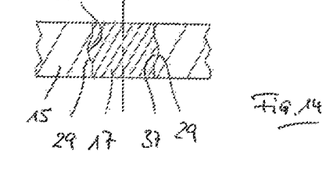
FIG. 14 is section XIV-XIV in FIG. 13.

Another possibility of a positive-locking connection is shown in FIGS. 13 and 14. The channel-like groove 11 has here a cross-sectional expansion 29 in a locally defined area in the area of the middle section of its height, so that the strip conductor 17 has laterally projecting projections, which mesh with the surrounding plastic body 15.

Figure 15:
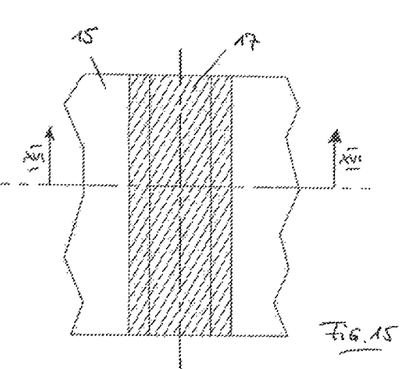
FIG. 15 is a third variant of an undercut.
Figure 16:
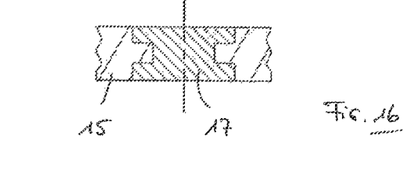
FIG. 16 is section XVI-XVI in FIG. 15.

A similar positive-locking action is achieved with the embodiment according to FIGS. 15 and 16, wherein the channel-like groove has an I-shaped cross section, which is completely filled by conductive material of the strip conductor 17. The strip conductor is reliably secured in this way against being detached and lifting off from the groove 11.

While specific embodiments of the invention have been shown and described in detail to illustrate the application of the principles of the invention, it will be understood that the invention may be embodied otherwise without departing from such principles.

The invention claimed is:

1. A plastic component comprising: at least one electrical contact element; a plastic body; and at least one electrical strip conductor, by means of which the electrical contact element can be electrically connected, wherein the plastic component is manufactured according to a combined injection molding and metal casting or metal injection molding method, in which the plastic body is manufactured by injection molding and the least one electrical strip conductor is manufactured by metal casting or metal injection molding the injection molding followed by the metal casting or metal injection molding or the metal casting or metal injection molding followed by the injection molding occur one after another, wherein the plastic body or the at least one electrical strip conductor formed last is molded into the plastic body or the at least one electrical strip conductor formed first, wherein the electrical contact element is a spring bracket contact, which encloses a spring bracket of the plastic body, at which spring bracket a section of the strip conductor is arranged, the spring bracket being formed in one piece with the plastic body, the spring bracket having a freely projecting configuration, the spring bracket being surrounded by a recess passing through the plastic body on all sides except for a side of the plastic body connected to the spring bracket.

2. A plastic component in accordance with claim 1, wherein the plastic body has a channel groove, in which the strip conductor is arranged.

3. A plastic component in accordance with claim 2, wherein the strip conductor is held in the groove with positive-locking at least in some areas.

4. A plastic component in accordance with claim 3, wherein undercuts, with which the strip conductor meshes at least partially, are formed in or at the groove.

5. A plastic component in accordance with claim 1, wherein in an area of a free end, the spring bracket has a projection, which is covered by the strip conductor.

6. A plastic component in accordance with claim 5, wherein the projection has a tip or pin configuration.

7. A plastic component in accordance with claim 1, wherein at least one contact rivet, which is electrically connected to the strip conductor, is integrated in the plastic body.

8. A plastic component in accordance with claim 1, wherein the plastic body has a plate-shaped configuration.

9. A plastic component in accordance with claim 1, wherein the spring bracket comprises a spring bracket outer surface, the plastic body comprising a plastic body outer surface, the spring bracket outer surface extending parallel to the plastic body outer surface.

10. A plastic component comprising: an electrical contact element; a plastic body, the plastic body comprising a through opening; and an electrical strip conductor, by means of which the electrical contact element can be electrically connected, wherein the plastic component is manufactured according to a combined injection molding and metal casting or metal injection molding method, in which the plastic body is manufactured by injection molding and the least one electrical strip conductor is manufactured by metal casting or metal injection molding the injection molding followed by the metal casting or metal injection molding or the metal casting or metal injection molding followed by the injection molding occur one after another, wherein the plastic body or the at least one electrical strip conductor formed last is molded into the plastic body or the at least one electrical strip conductor formed first, wherein the electrical contact element is a spring bracket contact, which encloses a spring bracket of the plastic body, at which spring bracket a section of the strip conductor is arranged, the spring bracket comprising only one side fixed to the plastic body, wherein the spring bracket extends into the through opening, the through opening being located between each part of the spring bracket and the plastic body except for the one side of the spring bracket fixed to the plastic body.

11. A plastic component in accordance with claim 10, wherein the one side of the spring bracket is integrally connected to the plastic body.

12. A plastic component in accordance with claim 11, wherein the spring bracket comprises a spring bracket outer surface, the plastic body comprising a plastic body outer surface, the spring bracket outer surface extending parallel to the plastic body outer surface.

13. A plastic component in accordance with claim 11, wherein each portion of the spring bracket is located at a spaced location from the plastic body except for the one side of the spring bracket.

14. A plastic component comprising: an electrical contact element; a plastic body, the plastic body comprising a through opening; and an electrical strip conductor, by means of which the electrical contact element can be electrically connected, wherein the plastic component is manufactured according to a combined injection molding and metal casting or metal injection molding method, in which the plastic body is manufactured by injection molding and the least one electrical strip conductor is manufactured by metal casting or metal injection molding the injection molding followed by the metal casting or metal injection molding or the metal casting or metal injection molding followed by the injection molding occur one after another, wherein the plastic body or the at least one electrical strip conductor formed last is molded into the plastic body or the at least one electrical strip conductor formed first, wherein the electrical contact element is a spring bracket contact, which encloses a spring bracket of the plastic body, at which spring bracket a section of the strip conductor is arranged, the spring bracket comprising a spring bracket end, wherein only the spring bracket end is in contact with the plastic body, wherein the through opening surrounds each portion of the spring bracket except for the spring bracket end.

15. A plastic component in accordance with claim 14, wherein the spring bracket end is integrally connected to the plastic body.

16. A plastic component in accordance with claim 15, wherein the spring bracket extends parallel to the plastic body, wherein each portion of the spring bracket is located at a spaced location from the plastic body except for the spring bracket end.

* * * * *